(12) United States Patent
Koyama et al.

(10) Patent No.: US 10,998,646 B2
(45) Date of Patent: May 4, 2021

(54) ELECTRICAL CONNECTION STRUCTURE, ELECTRICAL CONNECTION METHOD, ELECTRIC CONNECTOR, AND ELECTRIC DEVICE

(71) Applicant: SMK Corporation, Tokyo (JP)

(72) Inventors: Yuki Koyama, Tokyo (JP); Kiyoshi Asai, Kanagawa (JP); Toshihiko Kato, Kanagawa (JP)

(73) Assignee: SMK Corporation, Tokyo (JP)

(*) Notice: Subject to any disclaimer, the term of this patent is extended or adjusted under 35 U.S.C. 154(b) by 0 days.

(21) Appl. No.: 16/662,026

(22) Filed: Oct. 24, 2019

(65) Prior Publication Data

US 2020/0388936 A1 Dec. 10, 2020

(30) Foreign Application Priority Data

Jun. 10, 2019 (JP) .............................. JP2019-107905

(51) Int. Cl.
*H01R 4/06* (2006.01)
*H01R 12/58* (2011.01)
*H01R 13/24* (2006.01)

(52) U.S. Cl.
CPC .............. *H01R 4/06* (2013.01); *H01R 12/58* (2013.01); *H01R 13/2442* (2013.01)

(58) Field of Classification Search
CPC ....... H01R 4/06; H01R 12/58; H01R 13/2442
USPC ......................................................... 439/870
See application file for complete search history.

(56) References Cited

U.S. PATENT DOCUMENTS

| | | | | |
|---|---|---|---|---|
| 4,023,882 A | * | 5/1977 | Pettersson | H01R 4/26 439/426 |
| 6,357,953 B1 | * | 3/2002 | Ballantyne | F16B 5/0233 403/365 |
| 6,761,520 B1 | * | 7/2004 | Dise | F16B 33/002 411/113 |

(Continued)

FOREIGN PATENT DOCUMENTS

| | | |
|---|---|---|
| JP | S6350453 U | 4/1988 |
| JP | 2001006774 A | 1/2001 |

(Continued)

OTHER PUBLICATIONS

Office Action issued for counterpart Japanese Application No. 2019-107905, issued by the Japanese Patent Office dated Nov. 10, 2020 (drafted on Nov. 6, 2020).

*Primary Examiner* — Peter G Leigh

(57) ABSTRACT

There are provided an electrical connection structure, an electrical connection method and an electric connector capable of improving contact reliability, and an electric device including the electrical connection structure. The electrical connection structure includes a swage part configured to sandwich a first electric conductor and a sheet member having a second electric conductor, and an elastic member provided between the first electric conductor and the sheet member in a sandwiching portion of the swage part, the elastic member being configured to connect between the first electric conductor and the sheet member. The first electric conductor and the second electric conductor are electrically connected to each other via a contact point provided in the first electric conductor and a contact point provided in the second electric conductor in the sandwiching portion.

8 Claims, 9 Drawing Sheets

(56) References Cited

U.S. PATENT DOCUMENTS

| | | | |
|---|---|---|---|
| 8,382,413 B2* | 2/2013 | Nguyen | H01R 43/26 411/383 |
| 8,748,034 B2* | 6/2014 | Sasaki | H01M 2/0473 429/182 |
| 8,827,585 B2* | 9/2014 | Figge | B62D 25/147 403/168 |
| 8,997,336 B2* | 4/2015 | Strizki | H01R 4/34 29/729 |
| 9,350,088 B2* | 5/2016 | Suzuki | H01M 2/206 |
| 9,490,466 B2* | 11/2016 | Suzuki | H01R 4/06 |
| 9,748,671 B2* | 8/2017 | Takabayashi | H01R 4/34 |
| 9,897,128 B2* | 2/2018 | Sawai | F16B 37/067 |
| 2011/0045345 A1* | 2/2011 | Tsuchiya | H01M 2/22 429/179 |
| 2011/0281155 A1* | 11/2011 | Ito | H01M 2/065 429/179 |
| 2012/0064380 A1* | 3/2012 | Kim | H01M 2/06 429/66 |
| 2015/0200517 A1* | 7/2015 | Nguyen | H01R 43/002 29/842 |
| 2016/0159410 A1* | 6/2016 | Sahi | F16B 5/0635 29/525.08 |

FOREIGN PATENT DOCUMENTS

| | | | |
|---|---|---|---|
| JP | 2001052769 A | 2/2001 | |
| JP | 6182872 B2 | 8/2017 | |

* cited by examiner

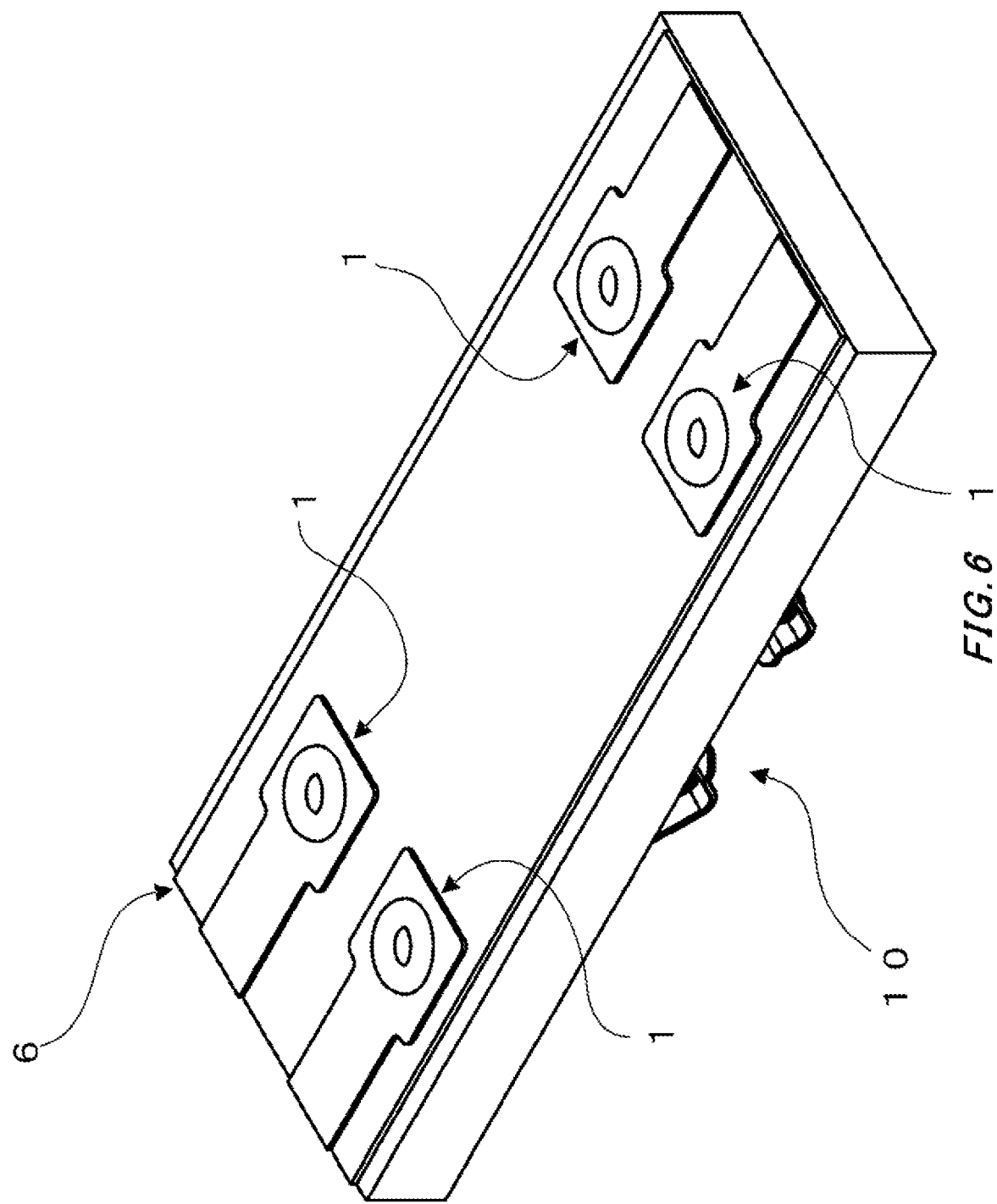

ELECTRICAL CONNECTION STRUCTURE, ELECTRICAL CONNECTION METHOD, ELECTRIC CONNECTOR, AND ELECTRIC DEVICE

CROSS REFERENCE TO RELATED APPLICATION

The contents of the following Japanese patent application are incorporated herein by reference, Japanese Patent Application No. 2019-107905 filed on Jun. 10, 2019.

FIELD

The present invention relates to an electrical connection structure, an electrical connection method and an electric connector, and an electric device including the electrical connection structure.

BACKGROUND

Techniques for electrically connecting two electric conductors by swaging have been known conventionally. Patent Literature 1 listed below, for example, discloses a technique in which a sealing layer such as a rubber plate is provided on either side of a hard substrate, terminals are placed on the both sides of the hard substrate via the sealing layers, and a rivet is then passed therethrough and fixed by swaging in order to electrically connect the terminals disposed on the both sides of the hard substrate. According to this technique, the terminals are brought into intimate contact with the rivet due to the reaction force of the sealing layers. Thus, its contact reliability is improved as compared to a case without the sealing layers.

CITATION LIST

Patent Literature

Patent Literature 1: Japanese Patent No. 6182872

SUMMARY

Technical Problem

The above-described technique disclosed in Patent Literature 1, however, has been made on the precondition that a hard substrate, i.e., a rigid part, is interposed, as a base member, between two electric conductors (terminals) for making electrical connection. When a base member having flexibility such as rubber is used, for example, sealing layers are more likely to be affected by shape changes in the base member, resulting in deterioration of the advantageous effect of improving contact reliability.

Accordingly, an object of the present invention is to provide an electrical connection structure, an electrical connection method and an electric connector capable of improving contact reliability, and an electric device including the electrical connection structure.

Solution to Problem

According to an aspect of the present invention, there is provided an electrical connection structure including:

a swage part configured to sandwich a first electric conductor and a sheet member having a second electric conductor; and an elastic member provided between the first electric conductor and the sheet member in a sandwiching portion of the swage part, the elastic member being configured to connect between the first electric conductor and the sheet member. In this electrical connection structure, the first electric conductor and the second electric conductor are electrically connected to each other via a contact point provided in the first electric conductor and a contact point provided in the second electric conductor in the sandwiching portion.

According to another aspect of the present invention, there is provided an electrical connection method including: providing, when sandwiching a first electric conductor and a sheet member having a second electric conductor by a swage part, an elastic member configured to connect between the first electric conductor and the sheet member between the first electric conductor and the sheet member in a sandwiching portion of the swage part; and electrically connecting the first electric conductor and the second electric conductor via a contact point provided in the first electric conductor and a contact point provided in the second electric conductor in the sandwiching portion.

According to still another aspect of the present invention, there is provided an electric connector including:

a swage part configured to sandwich a first electric conductor and a sheet member having a second electric conductor; and an elastic member provided between the first electric conductor and the sheet member in a sandwiching portion of the swage part, the elastic member being configured to connect between the first electric conductor and the sheet member. The electric connector is capable of electrically connecting the first electric conductor and the second electric conductor to each other via a contact point provided in the first electric conductor and a contact point provided in the second electric conductor in the sandwiching portion.

According to yet still another aspect of the present invention, there is provided an electric device including the aforementioned electrical connection structure.

Advantageous Effects of Invention

According to the present invention, contact reliability can be improved. It is to be understood that the advantageous effects provided in the specification by way of example should not be construed as limiting the contents of the present invention.

BRIEF DESCRIPTION OF DRAWINGS

FIG. 6 is a perspective view showing a configuration example of a rear side of the electric connector according to the third embodiment.

DESCRIPTION OF EMBODIMENTS

Figure 1:
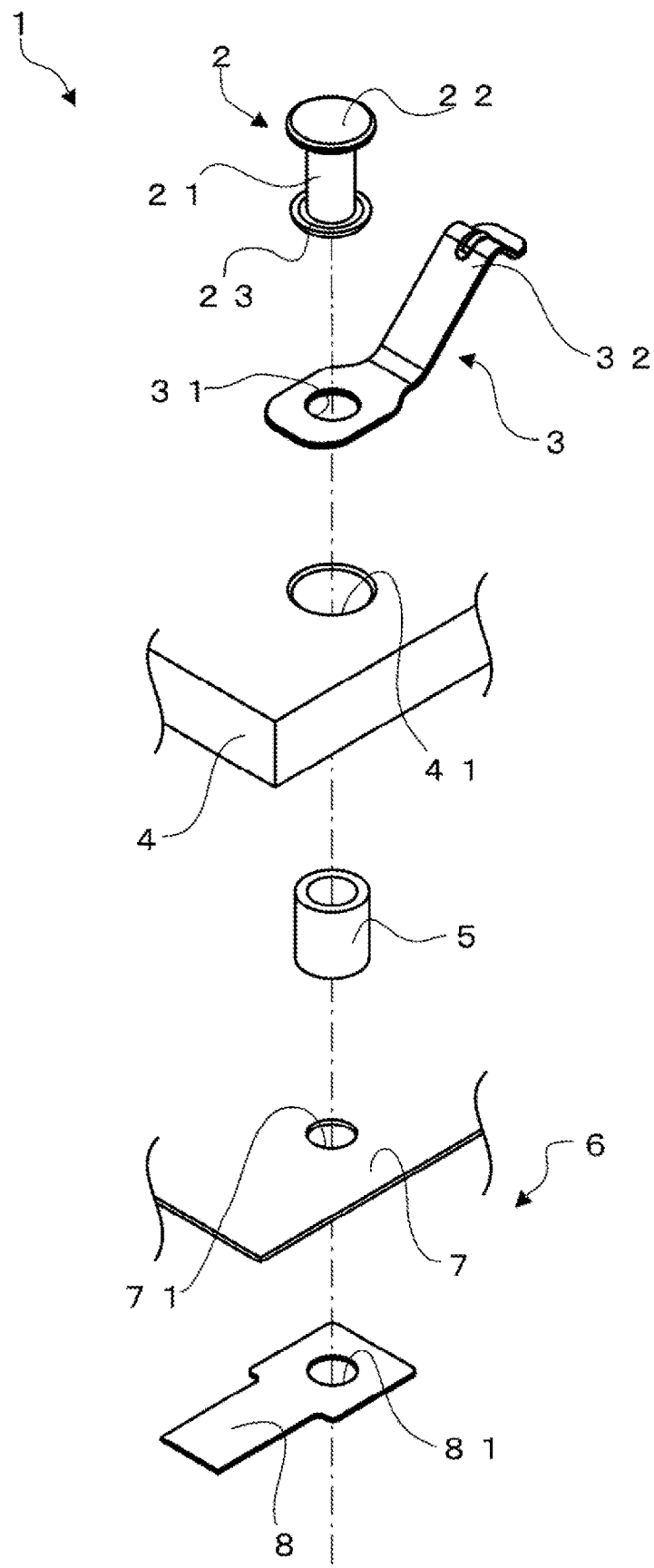
FIG. 1 is an exploded perspective view showing a configuration example of an electrical connection structure according to a first embodiment.

Embodiments of the present invention will be described below with reference to the drawings. The description will be provided in the following order.
1. First Embodiment
2. Second Embodiment
3. Third Embodiment
4. Modified Examples Note however that the following embodiments are given only to provide exemplary configurations for embodying the technical ideas of the present invention, and the present invention is not limited to such exemplary configurations. It is also noted that members set forth in the claims are not confined to members described in the embodiments. Unless explicitly noted otherwise, it is not intended that the scope of the present invention be limited by dimensions, materials, shapes, relative arrangements, and directions such as up, down, right, or left, among others, of components described in the embodiments. Such descriptions are provided by way of example only. Note that the sizes, positional relationships, etc., of members illustrated in the drawings may be exaggerated for clarity of description. Moreover, to avoid complexity of illustration, only some of reference numerals may be shown. In the following description, the same names and the same reference numerals refer to the identical or equivalent members, and their redundant description will be therefore omitted as appropriate. For elements that constitute the present invention, a plurality of elements may be configured as the same member so that the single member functions as the plurality of elements. Conversely, the function of a single member may be embodied by a plurality of members.

1. First Embodiment

Figure 2:
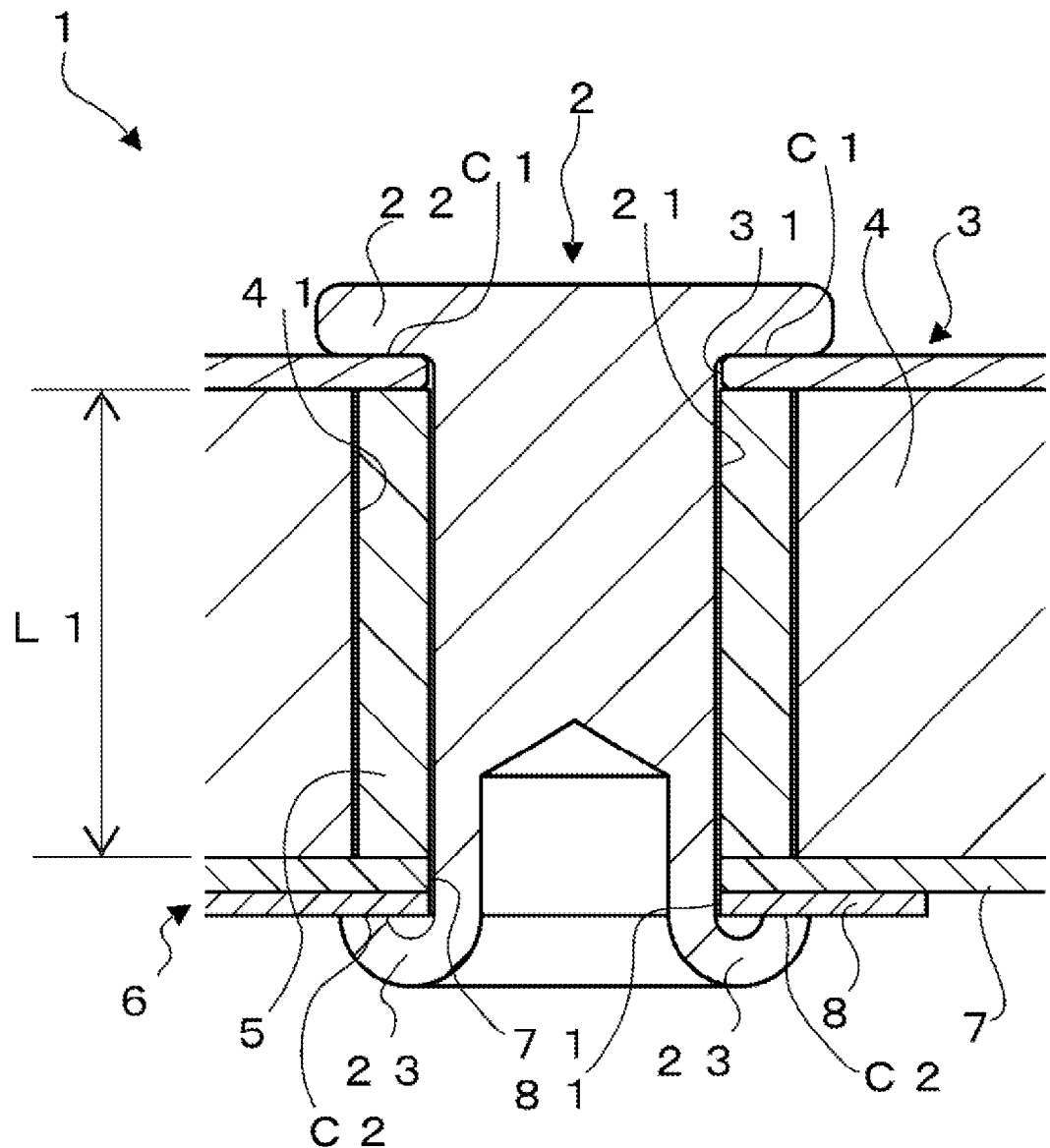
FIG. 2 is an enlarged cross-sectional view showing the configuration example of the electrical connection structure according to the first embodiment.

Configuration of Electrical Connection Structure:

FIG. 1 is an exploded perspective view showing a configuration example of an electrical connection structure 1 according to the first embodiment of the present invention. FIG. 2 is an enlarged cross-sectional view showing the configuration example of the electrical connection structure 1. As shown in FIGS. 1 and 2, the electrical connection structure 1 includes a swage part 2, a first electric conductor 3, a base member 4, an elastic member 5, and a sheet member 6. The sheet member 6 includes a sheet 7 and a second electric conductor 8. Note that the sheet 7 and the second electric conductor 8 may be provided as separate members instead of making the sheet member 6 by the sheet 7 and the second electric conductor 8. The electrical connection structure 1 electrically connects the first electric conductor 3 and the second electric conductor 8 by swaging.

The swage part 2 illustrated in FIGS. 1 and 2 presents a shape after being swaged. As shown in FIG. 2, the swage part 2 is a part configured to sandwich, by means of swaging, the first electric conductor 3 and the sheet member 6 with the elastic member 5 being interposed therebetween. Note that the swage part 2 in this embodiment possesses an electrically-conductive property. As an example, a rivet as shown in the figure may be used as the swage part 2. Specifically, the swage part 2 includes: a shaft portion 21 formed in a tubular or cylindrical shape; and a head portion 22 and a leg portion 23 provided at both ends of the shaft portion 21 and having larger diameters than that of the shaft portion 21 as shown in FIG. 1. The leg portion 23 is formed by plastic deformation due to swaging, for example. The swage part 2 sandwiches the members shown in FIG. 1, including from the first electric conductor 3 to the second electric conductor 8, by a sandwiching portion between the head portion 22 and the leg portion 23. Note that the shape, the structure, the type, the structure for sandwiching the members, and the like, of the swage part 2 are provided by way of example and are not limited to those illustrated in the figures.

The first electric conductor 3 is an electrically-conductive member (e.g., a metal terminal made of a metallic plate). The first electric conductor 3 includes an insertion hole 31 at one end thereof. As shown in FIG. 1, the first electric conductor 3, for example, has a bent shape such that a terminal portion 32 at the other end thereof protrudes from the base member 4 in the shape of a flat spring when the first electric conductor 3 is fixed to the base member 4 by the swage part 2. Note that the material or shape of the first electric conductor 3 is not limited to any particular material or shape. For example, the first electric conductor 3 may be a conductor pattern arranged on a substrate without being limited to the aforementioned metal terminal. Moreover, the first electric conductor 3 may be formed from an elastic body (a body having softness, flexibility, or stretchability, for example) such as an electrically-conductive film without being limited to a rigid body. As shown in FIG. 2, an outwardly-located surface of the first electric conductor 3 abuts against the head portion 22 of the swage part 2, whereas the other surface of the first electric conductor 3 abuts against the base member 4 and the elastic member 5 in the sandwiching portion of the swage part 2.

The base member 4 is an electrically-insulating thin-plate member made of, for example, a resin (e.g., plastic), rubber, fabric, or paper. As just described, the base member 4 may be formed from an elastic body (a body having softness, flexibility, or stretchability, for example) without being limited to a rigid body. The material of the base member 4 is not limited to any particular material. As shown in the figures, the base member 4 is provided with a fitting hole 41 into which the elastic member 5 to be described later is fitted. One surface of the base member 4 abuts against the first electric conductor 3, whereas the other surface of the base member 4 abuts against the sheet 7 of the sheet member 6.

The elastic member 5 is formed from an elastic body such as rubber. Note that any appropriate material, shape, or the like can be used for the elastic member 5. Specifically, the elastic member 5 may be formed from an O-ring, a rubber tube, or a coil spring, for example. Note that the elastic member 5 may possess an electrically-insulating property or an electrically-conductive property. As shown in FIG. 2, the elastic member 5 is provided between the first electric conductor 3 and the sheet member 6 in the sandwiching portion of the swage part 2. To be more specific, the elastic member 5 is provided in such a manner as to connect between the first electric conductor 3 and the sheet member 6. Specifically, the elastic member 5 is formed from a single part. More specifically, the elastic member 5 is formed in a tubular shape as shown in FIG. 1. As shown in FIG. 2, an outer diameter of this tubular shape is set to a size allowing the elastic member 5 to be fitted into the above-described fitting hole 41 of the base member 4, whereas an inner diameter of the tubular shape is set to a size allowing the above-described shaft portion 21 of the swage part 2 to be inserted therethrough. One end of the elastic member 5 located closer to the head portion 22 of the swage part 2 abuts against the first electric conductor 3, whereas the other end of the elastic member 5 located closer to the leg portion 23 abuts against the sheet 7 of the sheet member 6.

Figure 3:
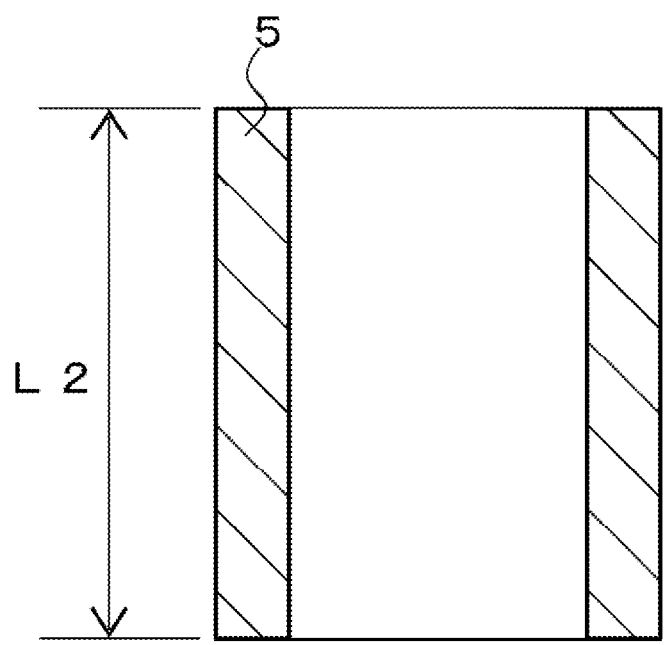
FIG. 3 is a cross-sectional view used to explain an exemplary dimension of an elastic member.

FIG. 3 is a cross-sectional view used to explain an exemplary dimension of the elastic member 5. As described above, the elastic member 5 connects between the first electric conductor 3 and the sheet member 6 in the electrical connection structure 1 (see FIG. 2). A dimension L2 (see FIG. 3) of the elastic member 5 corresponding to between the first electric conductor 3 and the sheet 7 in the electrical connection structure 1 is set to be larger than a dimension L1 (see FIG. 2) between the first electric conductor 3 and the sheet 7 (L2>L1). That is, the dimension L2 corresponding to between the first electric conductor 3 and the sheet 7 under natural conditions before the elastic member 5 is incorporated into the electrical connection structure 1 is set to be larger than the dimension L1 obtained after the elastic member 5 is incorporated into the electrical connection structure 1.

Consequently, the first electric conductor 3 and the sheet member 6 in the sandwiching portion of the swage part 2, which are shown in FIG. 2, are pressed against the head portion 22 and the leg portion 23 of the swage part 2, respectively, due to the reaction force of the elastic member 5. That is, the elastic member 5 causes the first electric conductor 3 to be pressed against the head portion 22 of the swage part 2 and causes the sheet member 6 to be pressed against the leg portion 23 of the swage part 2.

The sheet 7 is an electrically-insulating sheet-like member formed of, for example, fabric, rubber, paper, or a resin (e.g., plastic). As just described, the sheet 7 may be formed from a rigid body without being limited to an elastic body (a body having softness, flexibility, or stretchability, for example). The material of the sheet 7 is not limited to any particular material. As shown in the figures, the sheet 7 is provided with an insertion hole 71 through which the above-described shaft portion 21 of the swage part 2 is inserted. One surface of the sheet 7 abuts against the base member 4 and the elastic member 5, whereas the other surface of the sheet 7 abuts against the second electric conductor 8.

The second electric conductor 8 is formed from an electrically-conductive member (e.g., an electrically-conductive film). The second electric conductor 8 is provided with an insertion hole 81 through which the above-described shaft portion 21 of the swage part 2 is inserted. Note that the material or shape of the second electric conductor 8 is not limited to any particular material or shape. The second electric conductor 8 is not limited to the aforementioned electrically-conductive film, but may be electrically-conductive fiber, for example. Moreover, the second electric conductor 8 is not limited to an elastic body (a body having softness, flexibility, or stretchability, for example), but may be a rigid body such as a metal terminal or a conductor pattern arranged on a substrate.

Formation of Electrical Connection Structure:

The electrical connection structure 1 can be formed as follows, for example. First, the elastic member 5 is fitted into the fitting hole 41 of the base member 4. In the meantime, the second electric conductor 8 is formed on a surface of the sheet 7, and the insertion hole 71 and the insertion hole 81 are formed in the sheet 7 and the second electric conductor 8, respectively, thereby forming the sheet member 6. Note that the sheet 7 and the second electric conductor 8 may be individually formed as separate members as described above.

Subsequently, before swaging, i.e., before the leg portion 23 shown in FIG. 1 is formed by swaging, for example, the shaft portion 21 of the swage part 2 is sequentially inserted through the insertion hole 31 of the first electric conductor 3, the tubular portion of the elastic member 5 fitted into the fitting hole 41 of the base member 4, the insertion hole 71 of the sheet 7, and the insertion hole 81 of the second electric conductor 8. The swage part 2 is then swaged to form the leg portion 23. In this manner, the first electric conductor 3 and the sheet member 6 are fixed by swaging.

Consequently, the first electric conductor 3 and the sheet member 6 disposed opposed to each other are sandwiched by the swage part 2 as shown in FIG. 2. Note that the elastic member 5 provided between the first electric conductor 3 and the sheet member 6 connects between the first electric conductor 3 and the sheet member 6 in the sandwiching portion of the swage part 2. The first electric conductor 3 and the second electric conductor 8 are electrically connected to each other via a contact point C1 and a contact point C2 provided at the first electric conductor 3 and the second electric conductor 8, respectively, in the sandwiching portion of the swage part 2. To be more specific, the contact point C1 possessed by the first electric conductor 3 located in the sandwiching portion of the swage part 2 abuts against the head portion 22 of the swage part 2, thereby establishing electrical conduction with the swage part 2. The sheet member 6, on the other hand, includes the second electric conductor 8 on a side opposite to the side facing the first electric conductor 3. Thus, the contact point C2 possessed by the second electric conductor 8 located in the sandwiching portion of the swage part 2 abuts against the leg portion 23 of the swage part 2, thereby establishing electrical conduction with the swage part 2. This makes the first electric conductor 3 and the second electric conductor 8 electrically connected to each other via the swage part 2.

As described above, the electrical connection structure 1 interposes the elastic member 5 having reaction force between the first electric conductor 3 and the sheet member 6 in the sandwiching portion of the swage part 2. This can make contact reliability of the contact point C1 and the contact point C2 provided at the first electric conductor 3 and the second electric conductor 8, respectively, in the sandwiching portion of the swage part 2 less likely to be affected by shape changes in the base member 4 or the sheet 7, for example. Thus, the contact reliability can be improved. Even when no rigid parts are included between the first electric conductor 3 and the second electric conductor 8, for example, a sufficient level of contact pressure between the first electric conductor 3 and the head portion 22 of the swage part 2 at the contact point C1, and a sufficient level of contact pressure between the second electric conductor 8 and the leg portion 23 of the swage part 2 at the contact point C2 can be both achieved, thereby ensuring the contact reliability. This eliminates a need to provide a rigid part between the first electric conductor 3 and the second electric conductor 8.

Since the contact reliability of the both of the first electric conductor 3 and the second electric conductor 8 is improved by the configuration in which the elastic member 5 connects between the first electric conductor 3 and the sheet member 6, the elastic member 5 can be configured by a single part. This eliminates a need for the first electric conductor 3 and the second electric conductor 8 to provide separately a member for improving their contact reliability. That is, the number of parts can be reduced, and the number of assembly steps can be prevented from increasing.

2. Second Embodiment

Figure 4:
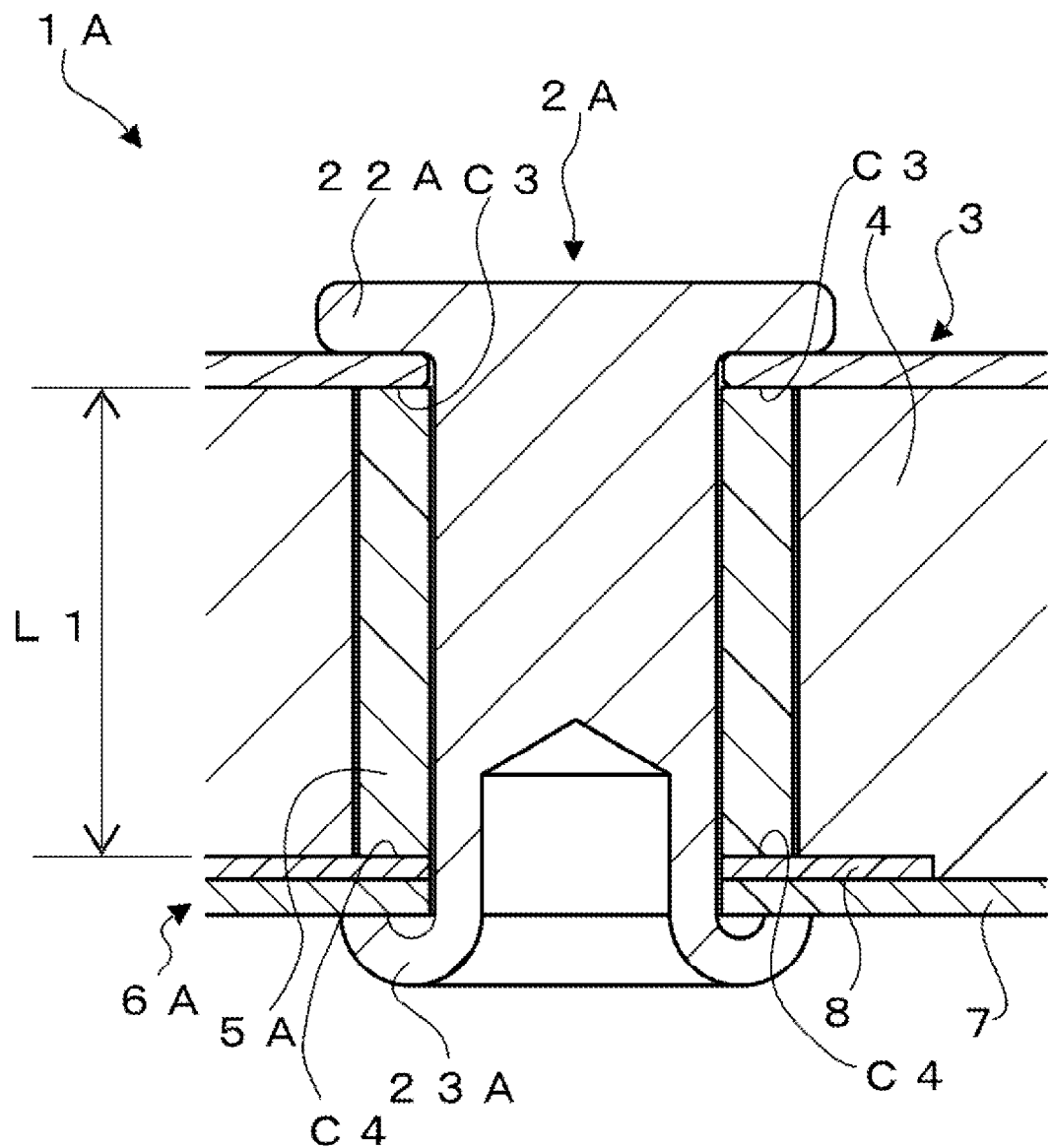
FIG. 4 is a cross-sectional view showing a configuration example of an electrical connection structure according to a second embodiment.

FIG. 4 is a cross-sectional view showing a configuration example of an electrical connection structure 1A according to the second embodiment of the present invention. As shown in the figure, the electrical connection structure 1A differs from the first embodiment in that a swage part 2A, an elastic member 5A, and a sheet member 6A are included in place of the swage part 2, the elastic member 5, and the sheet member 6 of the above-described electrical connection structure 1. Note that the swage part 2A in the present embodiment may or may not possess an electrically-conductive property, which is different from the swage part 2 in the first embodiment. Moreover, the elastic member 5A in the present embodiment possesses an electrically-conductive property, which is different from the elastic member 5 in the first embodiment. The other aspects are the same as those in the first embodiment.

As shown in FIG. 4, the sheet member 6A includes the above-described sheet 7 and second electric conductor 8, which is the same as the sheet member 6 in the first embodiment. In the electrical connection structure 1A, however, an arrangement of the sheet 7 and the second electric conductor 8 in the sheet member 6A differs from that in the sheet member 6 of the first embodiment. Specifically, the second electric conductor 8 in the electrical connection structure 1 of the first embodiment is disposed closer to the leg portion 23 of the swage part 2 relative to the sheet 7, thus obtaining a configuration in which the second electric conductor 8 is interposed between the sheet 7 and the leg portion 23 as shown in FIG. 2. The second electric conductor 8 in the electrical connection structure 1A of the present embodiment, on the other hand, is disposed closer to not a leg portion 23A but a head portion 22A of the swage part 2A relative to the sheet 7, thus obtaining a configuration in which the second electric conductor 8 is interposed between the sheet 7 and the elastic member 5A as shown in FIG. 4. That is, the sheet member 6A of the present embodiment is configured in such a manner that the position of the second electric conductor 8 relative to the sheet 7 is opposite to that in the sheet member 6 of the first embodiment.

That is, the first electric conductor 3 and the sheet member 6A disposed opposed to each other in the electrical connection structure 1A are sandwiched by the swage part 2A as with the first embodiment. The elastic member 5A provided between the first electric conductor 3 and the sheet member 6A connects between the first electric conductor 3 and the sheet member 6A in the sandwiching portion of the swage part 2A. The first electric conductor 3 and the second electric conductor 8 are electrically connected to each other via a contact point C3 and a contact point C4 provided at the first electric conductor 3 and the second electric conductor 8, respectively, in the sandwiching portion of the swage part 2A. To be more specific, the contact point C3 possessed by the first electric conductor 3 located in the sandwiching portion of the swage part 2A abuts against one end of the elastic member 5A, thereby establishing electrical conduction with the elastic member 5A. The sheet member 6A, on the other hand, includes the second electric conductor 8 on a side facing the first electric conductor 3. Thus, the contact point C4 possessed by the second electric conductor 8 located in the sandwiching portion of the swage part 2A abuts against the other end of the elastic member 5A, thereby establishing electrical conduction with the elastic member 5A. This makes the first electric conductor 3 and the second electric conductor 8 electrically connected to each other via the elastic member 5A.

As described above, the electrical connection structure 1A can achieve an improvement in contact reliability, a reduction in the number of parts, and prevention of an increase in the number of assembly steps as with the electrical connection structure 1 of the first embodiment.

Moreover, forming the elastic member 5A by a material having an electrically-conductive property enables the first electric conductor 3 and the second electric conductor 8 to be electrically connected to each other via the elastic member 5A, thereby improving a degree of freedom in the orientation of a conductor surface of the second electric conductor 8.

3. Third Embodiment

Figure 5:
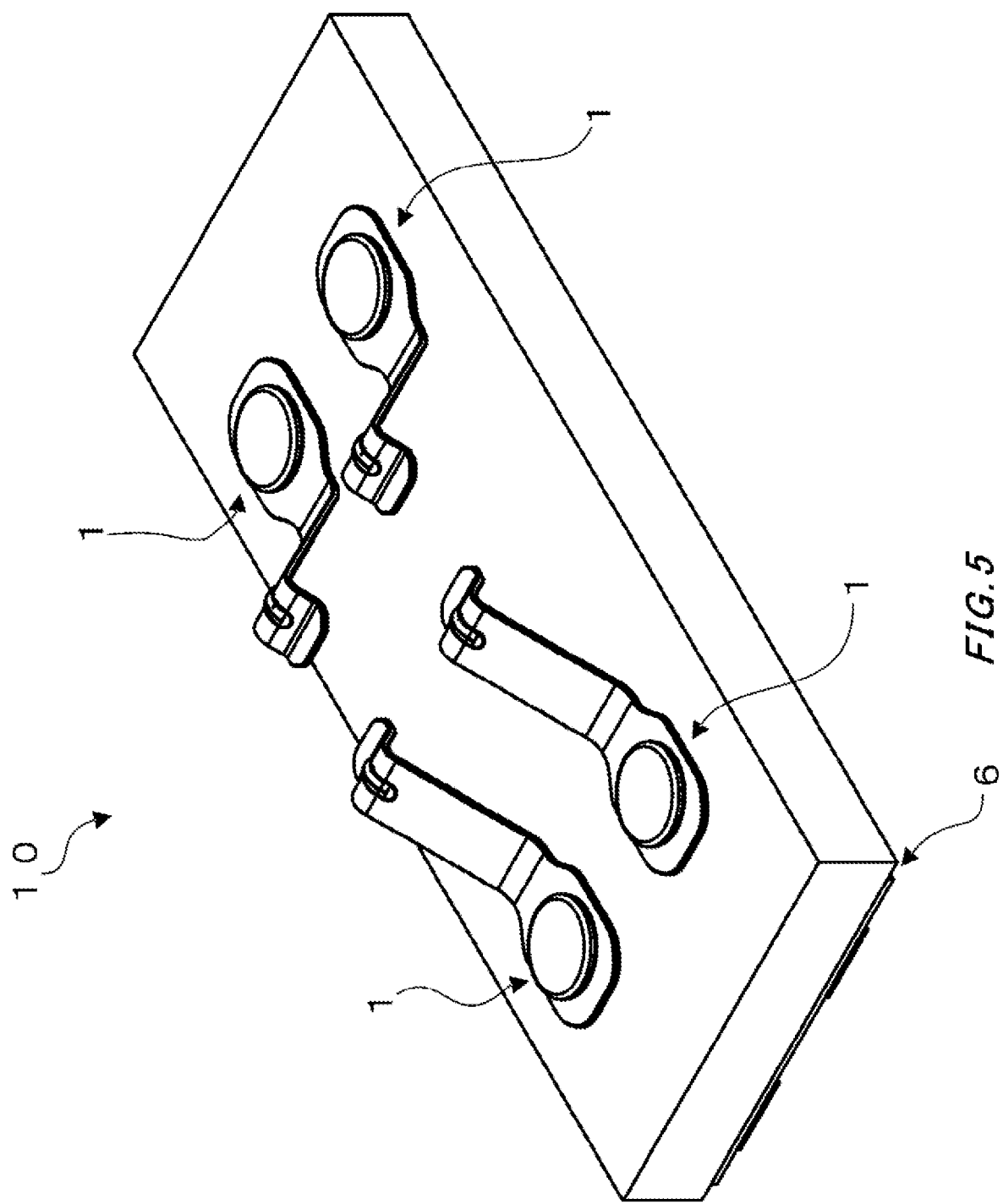
FIG. 5 is a perspective view showing a configuration example of a front side of an electric connector according to a third embodiment.

FIGS. 5 and 6 are perspective views showing a configuration example of an electric connector 10 according to the third embodiment. FIG. 5 shows a front-side configuration of the electric connector 10, and FIG. 6 shows a rear-side configuration of the electric connector 10. The illustrated electric connector 10 is capable of forming the electrical connection structures 1 of the first embodiment together with a sheet member 6 serving as an attached member to which the electric connector 10 is to be attached.

Specifically, the sheet member 6 is garment fabric on which an electrically-conductive pattern is arranged in a garment type wearable device, which is an electronic device (in the figure, only a part of the sheet member 6 is shown for ease of illustration). For example, the electric connector 10 can be fitted into a counterpart electric connector (not shown), and then used to electrically connect a sensor provided on the above-described garment to a controller (not shown) attached to the counterpart electric connector for controlling the sensor (such as power supply control, sensor control, or communication control, for example). While the electric connector 10 having four poles (a four-terminal connector) is illustrated in the present embodiment, the number of poles in the electric connector 10 is not limited thereto. Moreover, the arrangement of the terminals is not limited to the two-by-two matrix shown in the figure. That is, the number and arrangement of the electrical connection structures 1 formed by the electric connector 10 and the sheet member 6 are not limited to those shown in FIGS. 5 and 6.

Figure 7A:
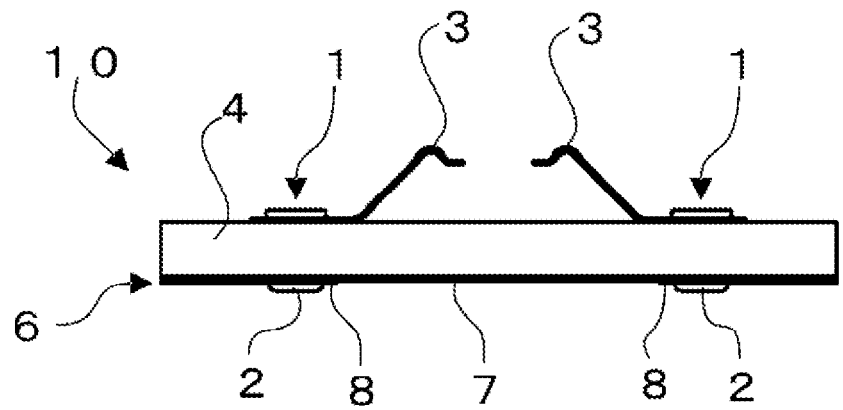
FIG. 7A provides a front view showing the configuration example of the electric connector according to the third embodiment.
Figure 7B:
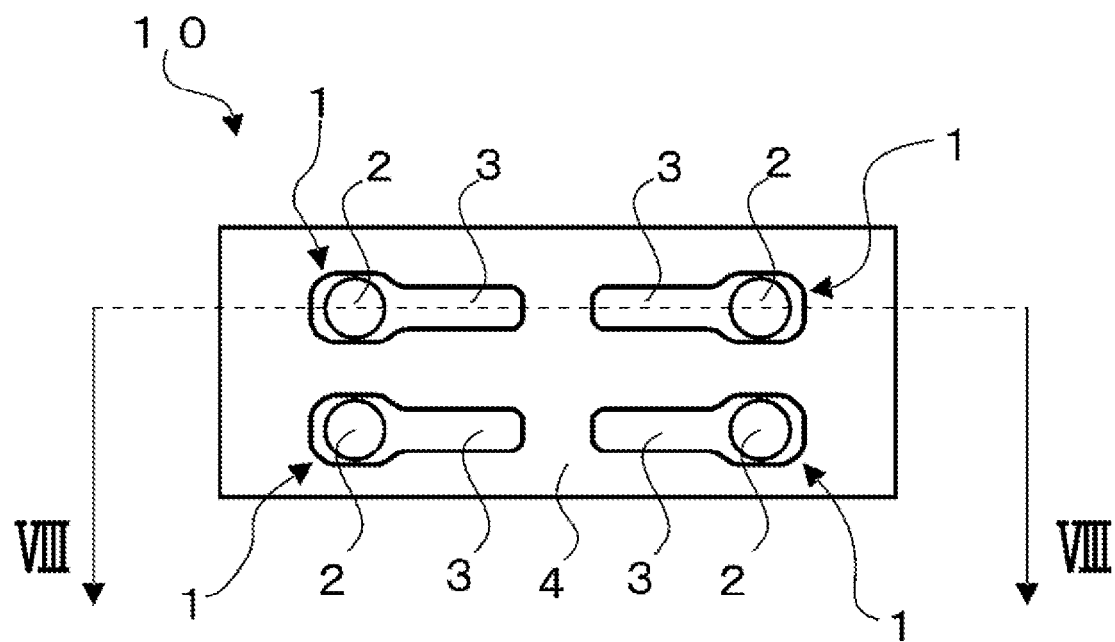
FIG. 7B provides a plan view showing the configuration example of the electric connector according to the third embodiment.
Figure 7C:
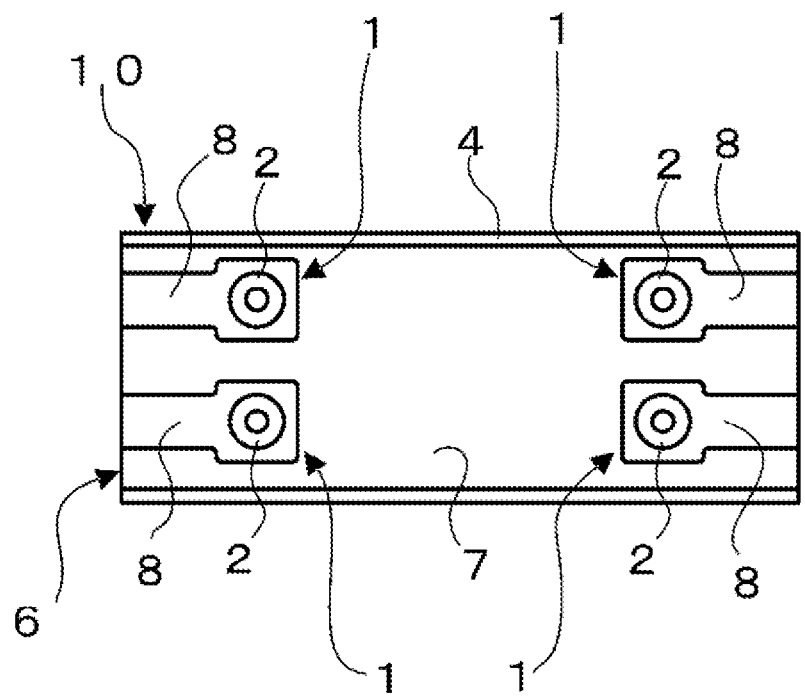
FIG. 7C provides a bottom view showing the configuration example of the electric connector according to the third embodiment.
Figure 7D:
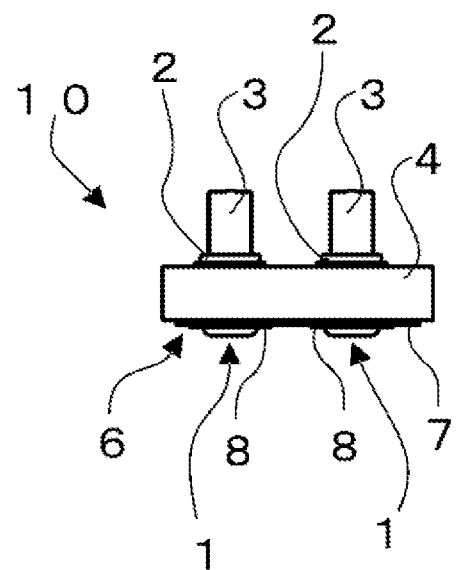
FIG. 7D provides a right side view showing the configuration example of the electric connector according to the third embodiment.
Figure 8:
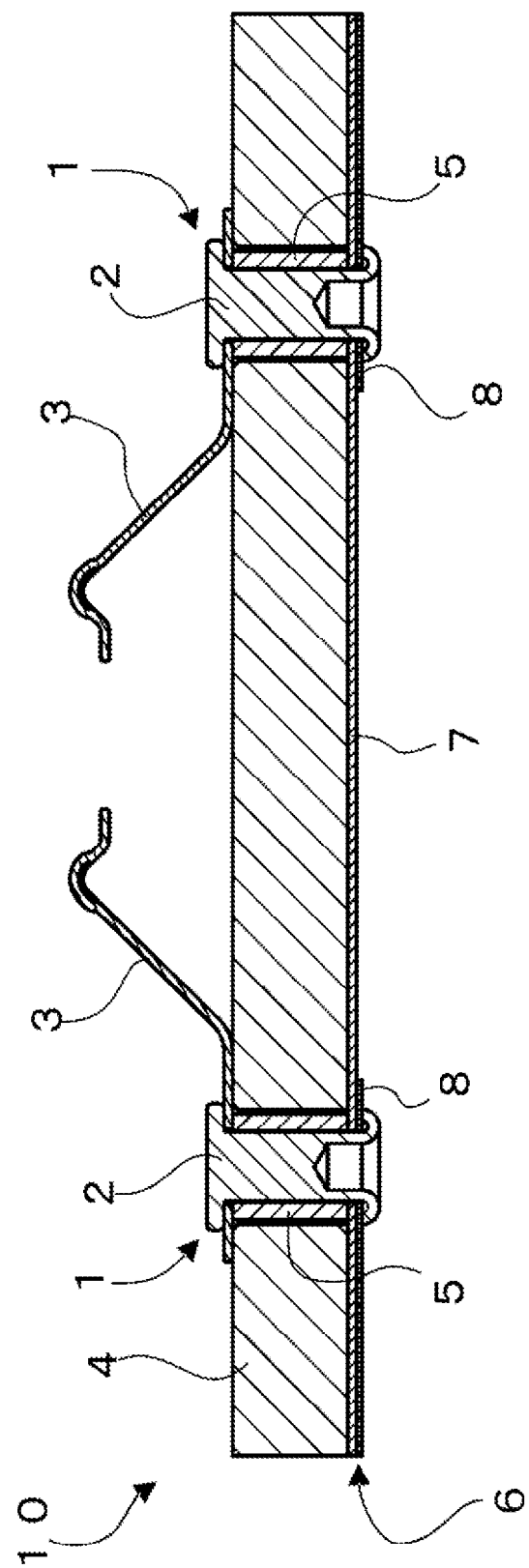
FIG. 8 is a cross-sectional view showing the configuration example of the electric connector according to the third embodiment.

FIGS. 7A-7D provide a front view, a plan view, a bottom view, and a right side view showing the configuration example of the electric connector 10 according to the third embodiment. FIG. 8 is a cross-sectional view of a portion indicated by a broken line in FIG. 7. As shown in FIG. 7A to FIG. 8, the electric connector 10 includes: four swage parts 2; four first electric conductors 3 serving as electric contacts; a base member 4 serving as a housing; and four elastic members 5 (see FIG. 8). The sheet member 6, on the other hand, includes a sheet 7 and four second electric conductors 8 serving as electrically-conductive patterns.

Note that the base member 4 and the sheet 7 are provided with four fitting holes 41 (see FIG. 1) and four insertion holes 71 (see FIG. 1), respectively, corresponding to the arrangement of the electrical connection structures 1.

In the thus-configured electric connector 10, for example, terminal portions 32 (see FIG. 1) of the four first electric conductors 3 abut against terminal portions in the aforementioned counterpart electric connector (not shown), thereby obtaining electrical connection therebetween.

As just described, the electric connector 10 has a configuration capable of forming the electrical connection structures 1 described in the first embodiment together with the sheet member 6. That is, the electric connector 10 has the configuration including: the swage part 2 that sandwiches the first electric conductor 3 and the sheet member 6 having the second electric conductor 8; and the elastic member 5, provided between the first electric conductor 3 and the sheet member 6 in the sandwiching portion of the swage part 2, for connecting between the first electric conductor 3 and the sheet member 6, and capable of electrically connecting the first electric conductor 3 and the second electric conductor 8 via the contact point C1 and the contact point C2 (see FIG. 2) provided in the first electric conductor 3 and the second electric conductor 8, respectively, in the sandwiching portion of the swage part 2. Thus, an improvement in contact reliability, a reduction in the number of parts, and prevention of an increase in the number of assembly steps can be achieved as with the case of the first embodiment.

Applications:

The present invention can be embodied as an electric device including the above-described electrical connection structure 1 or 1A. Examples of such an electric device including the electrical connection structure 1 or 1A may include all of electric devices each including the electrical connection structure 1 or 1A such as wearable devices (e.g., garment type wearable devices), IoT devices, computer devices, audio/visual devices, mobile devices, cooking appliances, in-car devices, lighting equipment, and air conditioning devices.

4. Modified Examples

While the embodiments of the present invention have been specifically described above, the contents of the present invention are not limited to the above-described embodiments and various modification can be made thereto.

In each of the above-described electrical connection structures 1 and 1A, the configuration in which the elastic member 5 or 5A and the first electric conductor 3 as well as the first electric conductor 3 and the swage part 2 or 2A are in direct contact with each other has been shown by way of example. The present invention, however, is not limited thereto. For example, the elastic member 5 or 5A and the first electric conductor 3 as well as the first electric conductor 3 and the swage part 2 or 2A may be configured to interpose a member for stabilizing contact position, such as a washer, therebetween. Similarly, the configuration in which the elastic member 5 or 5A and the sheet member 6 or 6A as well as the sheet member 6 or 6A and the swage part 2 or 2A are in direct contact with each other has been shown by way of example. The present invention, however, is not limited thereto. The elastic member 5 or 5A and the sheet member 6 or 6A as well as the sheet member 6 or 6A and the swage part 2 or 2A may be configured to interpose a member for stabilizing contact position, such as a washer, therebetween. That is, the elastic member 5 or 5A may be configured to connect between the first electric conductor 3 and the sheet member 6 or 6A in the sandwiching portion of the swage part 2 or 2A indirectly via the member for stabilizing contact position.

In each of the above-described electrical connection structures 1 and 1A, the configuration including both of the base member 4 and the sheet 7 has been provided by way of example. The present invention, however, is not limited thereto. For example, at least one of the base member 4 and the sheet 7 may not be included.

While the above-described electric connector 10 is capable of including the electrical connection structure 1, the electric connector 10 may be capable of including the electrical connection structure LA, for example.

REFERENCE SIGNS LIST 1, 1A Electrical connection structure
2, 2A Swage part
3 First electric conductor
4 Base member
5, 5A Elastic member
6, 6A Sheet member
7 Sheet
8 Second electric conductor
21 Shaft portion
22 Head portion
23 Leg portion
C1, C2, C3, C4 Contact point

The invention claimed is:

1. An electrical connection structure comprising:
a swage part configured to sandwich a first electric conductor and a sheet member having a second electric conductor; and
an elastic member provided between the first electric conductor and the sheet member in a sandwiching portion of the swage part, the elastic member being configured to have a first end in direct contact with the first electric conductor and a second end in direct contact with the sheet member, wherein
the first electric conductor and the second electric conductor are electrically connected to each other via a first contact point by the swage part in the sandwiching portion with the first electric conductor, and a second contact point by the swage part in the sandwiching portion with the sheet member having the second electric conductor.

2. The electrical connection structure according to claim 1, wherein the sheet member includes the second electric conductor on a side opposite to a side facing the first electric conductor, so that the first electric conductor and the second electric conductor are electrically connected to each other via the swage part.

3. The electrical connection structure according to claim 1, wherein the sheet member includes the second electric conductor on a side facing the first electric conductor, so that the first electric conductor and the second electric conductor are electrically connected to each other via the elastic member.

4. The electrical connection structure according to claim 1, wherein the elastic member is formed from a single part.

5. The electrical connection structure according to claim 1, wherein the elastic member has a dimension corresponding to between the first electric conductor and the sheet member that is larger than a dimension between the first electric conductor and the sheet member.

6. An electric device comprising the electrical connection structure according to claim 1.

7. An electric connector comprising:
- a swage part configured to sandwich a first electric conductor and a sheet member having a second electric conductor; and
- an elastic member provided between the first electric conductor and the sheet member in a sandwiching portion of the swage part, the elastic member being configured to have a first end in direct contact with the first electric conductor and a second end in direct contact with the sheet member, so that the electric connector is capable of electrically connecting the first electric conductor and the second electric conductor to each other via a first contact point by the swage part in the sandwiching portion with the sheet member having the first electric conductor and a contact point provided in the second electric conductor.

8. An electrical connection method comprising:
- providing, when sandwiching a first electric conductor and a sheet member having a second electric conductor by a swage part, an elastic member configured to have a first end in direct contact with the first electric conductor and a second end in direct contact with the sheet member between the first electric conductor and the sheet member in a sandwiching portion of the swage part; and
- electrically connecting the first electric conductor and the second electric conductor via a first contact point by the swage part in the sandwiching portion with the first electric conductor, and a second contact point by the swage part in the sandwiching portion with the sheet member having the second electric conductor.

* * * * *